(12) United States Patent
Young et al.

(10) Patent No.: US 8,395,177 B2
(45) Date of Patent: Mar. 12, 2013

(54) PACKAGE FOR PROTECTING A DEVICE FROM AMBIENT SUBSTANCES

(75) Inventors: Edward Willem Albert Young, Eindhoven (NL); Johannes Krijne, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 860 days.

(21) Appl. No.: 12/518,900

(22) PCT Filed: Dec. 12, 2007

(86) PCT No.: PCT/IB2007/055046
§ 371 (c)(1),
(2), (4) Date: Jun. 12, 2009

(87) PCT Pub. No.: WO2008/075254
PCT Pub. Date: Jun. 26, 2008

(65) Prior Publication Data
US 2010/0025723 A1 Feb. 4, 2010

(30) Foreign Application Priority Data
Dec. 19, 2006 (EP) .................................... 06126525

(51) Int. Cl.
*H01L 33/00* (2010.01)
(52) U.S. Cl. .............. 257/99; 257/E23.18; 257/E23.193; 257/E33.056

(58) Field of Classification Search .................... 257/99, 257/E23.18, E23.193, E33.056
See application file for complete search history.

(56) References Cited

U.S. PATENT DOCUMENTS

| | | |
|---|---|---|
| 2003/0027369 A1 | 2/2003 | Yamazaki |
| 2003/0122476 A1 | 7/2003 | Wang et al. |
| 2004/0043249 A1 | 3/2004 | Su et al. |
| 2004/0229051 A1 | 11/2004 | Schaepkens et al. |
| 2004/0238846 A1 * | 12/2004 | Wittmann et al. ............ 257/200 |
| 2005/0001547 A1 | 1/2005 | Yamazaki et al. |

FOREIGN PATENT DOCUMENTS

| | | |
|---|---|---|
| JP | 2001118674 A | 4/2001 |
| JP | 2002246172 A | 8/2002 |
| WO | 2005101542 A1 | 10/2005 |
| WO | 2006107379 A1 | 10/2006 |
| WO | 2006115530 A1 | 11/2006 |

* cited by examiner

*Primary Examiner* — Stephen W Smoot
*Assistant Examiner* — Vicki B Booker
(74) *Attorney, Agent, or Firm* — Mark Beloborodov; David Zivan

(57) ABSTRACT

A package (1; 20) for protecting a device (2; 21) from ambient substances, the package comprising an enclosure surrounding the device (2; 21). The enclosure includes a multi-layer barrier (7; 24) and an internal substance binding member (14; 27) which is provided inside the enclosure to bind at least one of said ambient substances having penetrated the enclosure. The package (1; 20) further comprises an intermediate substance binding member (14; 29) which is provided between an inner (11a-b; 25) and an outer (16a-b; 28) barrier layer of the multi-layer barrier (7; 24) to bind a fraction of the substance having penetrated the outer barrier layer (16a-b; 28).

11 Claims, 2 Drawing Sheets

PACKAGE FOR PROTECTING A DEVICE FROM AMBIENT SUBSTANCES

TECHNICAL FIELD OF THE INVENTION

The present invention relates to a package for protecting a device from ambient substances, to a lighting device in which an OLED is protected by such a package, and to a sensing device in which a sensor is protected by such a package.

TECHNICAL BACKGROUND

Many kinds of devices need to be protected from various ambient substances, such as water vapor or oxygen, by means of a package in order to achieve an acceptable device lifetime. Such devices needing to be protected include, for example, electronic components, such as organic light-emitting diodes (OLEDs) and micro-electro-mechanical systems (MEMS).

In the cases when the devices to be protected are rigid and can be packaged in a rigid package, a sufficiently gas-tight package is typically realized by providing the package in the form of impermeable base and lid parts, which are bonded together following placement of the device to be protected on the base.

When, however, the devices to be protected are flexible, the package is typically also required to be flexible. Several approaches have been tried to achieve a flexible package which has a sufficiently low leakage rate with respect to one or several particular ambient substances to obtain an acceptable device lifetime.

According to one approach, one or several layers of inorganic coatings are deposited on the bottom side of the flexible substrate on which the device to be protected is mounted, and on top of the device. However, these coating have so-called pinholes, which allow penetration of ambient substances, such as moisture and oxygen.

According to another approach, as disclosed in, for example, JP 2001-118674, an OLED is mounted on a flexible transparent multi-layer substrate which is treated to prevent moisture and air from penetrating the substrate and reaching the OLED through the substrate. In order to enclose the OLED, a closure film, comprising a metallic foil layer and an insulator layer is fixed to the substrate around the OLED by means of an adhesive. Subsequently, the closed space formed by the substrate with mounted OLED and the closure film is evacuated and sealed so that the OLED is vacuum-packed. In order to adsorb moisture entering the package through the substrate and/or the closure film, a drying-agent layer is provided on the inside of the closure film.

Such a package is, however, not an optimal solution, since a large number of inorganic/organic layers are typically required to obtain a sufficiently low leakage rate through the package. A production process for producing such a virtually pin-hole free multi-layer structure is typically sensitive and requires that the formation of the different layers takes place in a clean-room in order to obtain an acceptable yield. Consequently, such a multi-layer structure is costly to manufacture, while still exhibiting an insufficient leakage performance.

Accordingly, there is a need for an improved and/or more cost-efficient package for protecting a device from ambient substances.

OBJECTS OF THE INVENTION

In view of the above-mentioned and other drawbacks of the prior art, a general object of the present invention is to provide an improved package for protecting a device from ambient substances.

A further object of the present invention is to enable production of a more cost-efficient protective package for protecting a device from ambient substances.

SUMMARY OF THE INVENTION

According to the present invention, these and other objects are achieved through a package for protecting a device from an ambient substance, the package comprising an enclosure surrounding the device, the enclosure including a multi-layer barrier and an internal substance binding member which is provided inside the enclosure to bind a substance from the ambient environment having penetrated the enclosure, wherein the package further comprises an intermediate substance binding member which is provided between an inner and an outer barrier layer of the multi-layer barrier to bind a fraction of the substance having penetrated the outer barrier layer.

A "substance binding member" is a structure comprising an material which is capable of binding a substance by any mechanism, chemical or physical, including absorption. Included among substance binding members are so-called "getters". The substance binding member may be composed of one or several different materials, which each may be selected to bind a particular substance. For example, these materials may have voids or open spaces close to the molecular diameter of the molecules of the substance to be bound, such as $H_2O$, $CO_2$, $O_2$ or $N_2$. Examples of such materials include sintered alumina gel, alumina-silicate gel and silica gel. Furthermore, calcium oxide may be used as a material for binding, by adsorption, $CO_2$ and $H_2O$ and phosphoric anhydride may be used to bind $H_2O$.

The present invention is based upon the realization that the leakage of a substance, such as moisture or oxygen, from an ambient environment through a multi-layer barrier can be efficiently reduced by binding the substance in between the barrier layers.

By binding the substance, such as moisture or oxygen, between the barrier layers, the number of molecules of the substance available for penetration through the inner barrier layer is reduced in correspondence with the binding capability of the intermediate substance binding member.

Furthermore, the intermediate substance binding member prevents the outer barrier layer from being saturated by the substance, thereby maintaining the leakage prevention capability of the outer barrier layer over time.

Through the present invention, the use of relatively simple and cost-efficient barrier layers is enabled, since the absence of flaws, such as pin-holes, is not critical for preventing a substance from the ambient from penetrating the multi-layer barrier.

Furthermore, the multi-layer barrier may be transparent, whereby the package according to the present invention becomes suitable for protecting devices that need to optically interact through the package. Such devices may include, for example, light-emitting devices and optical sensors.

Moreover, the multi-layer barrier may be flexible, whereby a flexible device, such as a flexible OLED may be protected by the package according to the present invention, while maintaining its flexible property also in its packaged state.

Advantageously, furthermore, the multi-layer barrier may be formed by inner and outer organic films, each having an inorganic barrier layer.

Such a film, or barrier foil may be produced in a completely separate process. The barrier layer and base film can be selected and produced in a large scale, at dedicated process conditions to ensure the highest quality, without any restrictions imposed by the device to be protected or the other parts comprised in the package. Such restrictions, for example, in the case of the device being an OLED include restrictions on the processing temperature.

For example, if the device to be protected by the package is an OLED, it is generally accepted that a leakage rate of moisture through the package of less than $10^{-6}$ g/m²day is required in order to obtain an acceptable life time of the OLED. Such a low leakage rate cannot be obtained by any organic barrier material. An organic film typically has a leak rate in excess of $10^{-1}$ g/m²day. Inorganic films, on the other hand, can easily meet the requirement of $10^{-6}$ g/m²day. However, the occurrence of pin-holes and other defects in inorganic films entail that a typical leakage rate of a barrier foil being formed by an organic film having an inorganic barrier layer is around $10^{-2}$ g/m²day.

By providing two such mass-production friendly, readily available and relatively inexpensive barrier foils in series with a substance binding member in between the foils, the total leakage rate through the multi-layer barrier may be reduced to the required level of $10^{-6}$ g/m²day given that this intermediate substance binding member is designed to have a sufficient moisture binding capacity.

Furthermore, the internal substance binding member may be provided on this inner organic film or barrier foil, and the intermediate substance binding member may be provided on this outer organic film or barrier foil. For example, a suitable substance binding material may be laminated to the respective barrier foil.

Preferably, the internal and intermediate substance binding members comprised in the package according to the present invention may be adapted to bind at least one of oxygen and moisture.

According to one embodiment of the package according to the present invention, furthermore, the device to be protected may be mounted on a rigid carrier which is impermeable to the ambient substance, and the multi-layer barrier may be bonded to the rigid carrier to enclose the device to be protected.

The rigid carrier may, for example, be made of a ceramic, of glass or metal, and the multi-layer barrier may be bonded to the rigid carrier by means of, for example, an adhesive, a heat-seal process or fusing of the carrier and barrier materials.

According to another embodiment of the package according to the present invention, the device to be protected may be mounted on a flexible carrier, and the multi-layer barrier may comprise an inner barrier layer being formed by an inner film enclosing the device and an outer barrier layer being formed by an outer film enclosing the inner barrier layer, and the multi-layer barrier barrier may be configured to enable electrical connection between the protected device and an external device.

Hereby, a device to be protected which is mounted on a flexible substrate or carrier can be efficiently protected from an ambient substance without the need for any special leakage-reduction layers or the like being formed on the substrate, but a standard substrate, such as a polyimide film, can be used.

The inner and outer films may be provided separately, or as a preformed multi-layer barrier film having an intermediate substance binding member sandwiched between an inner and an outer layer of the multi-layer barrier film.

Furthermore, each of the inner and outer films may be provided in the form of a bag into which the device supporting portion of the device carrier and the device are inserted, whereafter the open end of the bag is closed.

Alternatively, each of the inner and outer films may be provided as a pair of sheets, between which at least a portion of the carrier and the device are placed. Thereafter, the upper and lower film sheets are bonded to each other to enclose the carrier portion and device. This bonding may, for example, be performed by means of heat-sealing.

The above-mentioned flexible carrier may, furthermore, have a device-supporting portion and a lead-out portion, and the inner film may enclose the device and the device-supporting portion of the carrier, and may be bonded to upper and lower faces of the lead-out portion of the carrier such that the lead-out portion penetrates the inner barrier layer and the outer film may enclose the inner barrier layer, and may be bonded to the upper and lower faces of the lead-out portion of the carrier such that the lead-out portion penetrates the outer barrier layer, thereby enabling electrical connection between the protected device and an external device through the lead-out portion of the carrier.

Alternatively, the multi-layer barrier may further comprise an electrically conductive lead-through for enabling electrical conduction from an internal conductor structure provided on an inside of the multi-layer barrier to an external conductor structure provided on an outside of the multi-layer barrier, and the internal conductor structure may be electrically connected to the protected device, thereby enabling electrical connection between the protected device and an external device via the lead-through and the external conductor structure.

Moreover, the package according to the present invention may advantageously be comprised in a light-emitting device, further comprising an OLED.

Additionally, the package according to the present invention may advantageously be comprised in a sensing device, further comprising a sensor.

BRIEF DESCRIPTION OF THE DRAWINGS

These and other aspects of the present invention will now be described in more detail, with reference to the appended drawings showing a currently preferred embodiment of the invention, wherein.

DETAILED DESCRIPTION OF A PREFERRED EMBODIMENT OF THE INVENTION

In the following description, the present invention is described with reference to OLED-packages having a transparent multi-layer barrier formed by an inner barrier foil having an internal substance binding member provided on the inside thereof, and an outer barrier foil having an intermediate substance binding member provided on the inside thereof. The OLED is enclosed through heat-sealing of the barrier foils.

It should be noted that this by no means limits the scope of the invention, which is equally applicable to any other protective package having a multi-layer barrier which at least partly encloses the device to be protected, the multi-layer barrier having an internal substance binding member inside the package and an intermediate substance binding member between an inner and an outer barrier layer of the multi-layer barrier.

For example, the internal substance binding member need not be provided on the inside of the multi-layer barrier, but may be provided anywhere inside the enclosure formed by the package, such as on the device carrier or on the device. Furthermore, the intermediate substance binding member need not be provided on an outer barrier foil, but may be provided on the inner layer before adding the outer layer. Moreover, the multi-layer barrier may be pre-fabricated with an intermediate substance binding member sandwiched between two of the layers comprised in the multi-layer barrier.

Furthermore, the multi-layer barrier, or the layers or films constituting the multi-layer barrier need not be made to enclose the device to be protected by means of heat-sealing. For example, an adhesive requiring pressure only, or welding may be used, and mechanical clamping may also be feasible.

Additionally, the enclosed space and/or any space between inner and outer layers may be evacuated during package manufacturing, or be filled with an inert gas, such as nitrogen, or filled with a substance, such as a glue, that has a high diffusion rate for water in order to enable rapid transport of water/moisture having penetrated the outer layer towards the substance binding member(s) provided between the inner and outer layers.

Figure 1A:
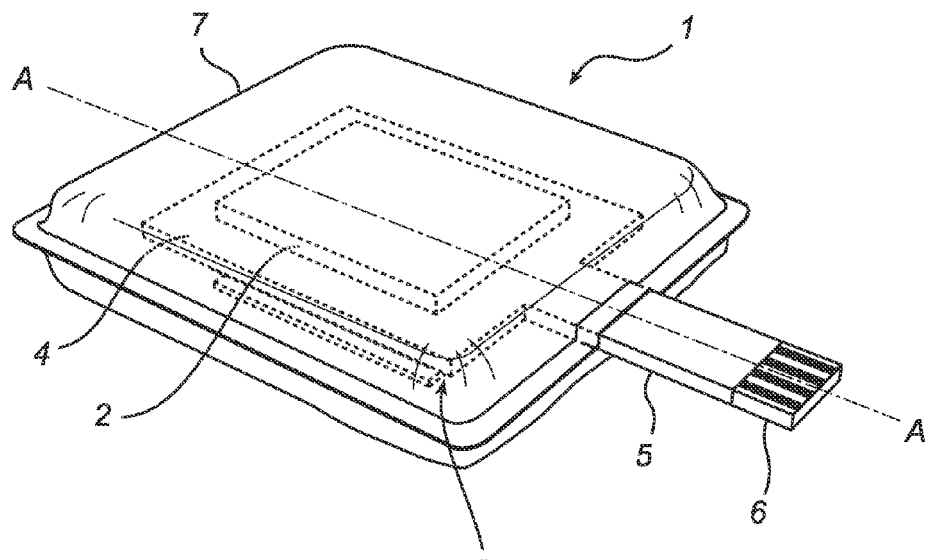
FIG. 1a is a schematic perspective view of a first embodiment of a package according to the present invention, protecting an OLED from the ambient.

In FIG. 1a, a flexible OLED-package 1 according to a first embodiment of the present invention is schematically shown, where an OLED 2 is mounted on a flexible carrier 3, having a device-supporting portion 4 and a lead-out portion 5 for enabling electrical connection of the OLED 2 to an external device at the flex connector 6. The OLED 2 is protected from substances from the ambient, such as moisture and oxygen, by a multi-layer barrier 7 which encloses the OLED 2 and the device-supporting portion 4 of the carrier 3 and is bonded to the upper and lower faces of the lead-out portion 5 of the carrier 3 so that the lead-out portion 5 penetrates the enclosure formed by the multi-layer barrier 7, thereby enabling electrical connection of the OLED 2 to an external device.

An exemplifying structure of the multi-layer barrier 7 in FIG. 1a will now be described with reference to FIG. 1b, which is a section view along the line A-A of a portion of the package in FIG. 1a.

Figure 1B:
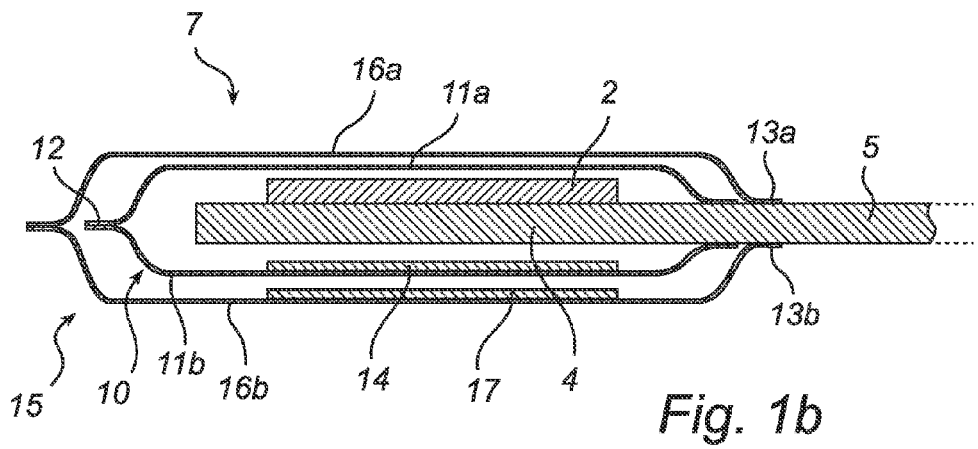
FIG. 1b is a schematic section view of a portion of the package in FIG. 1a along the line A-A.

As illustrated in FIG. 1b, the OLED 2 and the device-supporting portion 4 of the carrier 3 is enclosed by an inner barrier layer 10 formed by an upper film sheet 11a and a lower film sheet 11b which are heat-sealed together along the perimeter 12 of the inner barrier layer 10, except for the portion of the perimeter corresponding to the lead-out portion 5 of the carrier 3, where the upper 11a and lower 11b film sheets are heat sealed to the upper 13a and lower 13b faces of the lead-out portion 5, respectively. Inside the inner barrier layer 10, here on the lower film sheet 11b, an internal substance binding member 14 is provided to bind, molecules of a substance having penetrated the inner barrier layer 10.

The inner barrier layer 10 is in turn enclosed by an outer barrier layer 15, which is formed by upper 16a and lower 16b film sheets as described above for the inner barrier layer 10. Inside the outer barrier layer 15, here on the lower film sheet 16b, an intermediate substance binding member 17 is provided to bind molecules of a substance having penetrated the outer barrier layer 15, which effieciently reduces the number of molecules of the substance available for penetration through the inner barrier layer 10.

The inner 10 and outer 15 barrier layers are, in FIG. 1b and the corresponding description above, provided in the form of upper and lower film sheets. As is readily understood by a person skilled in the art, the inner 10 and outer 15 barrier layers may just as well be provided in the form of bags, which are closed on one side only upon enclosure.

Furthermore, the inner 10 and outer 15 barrier layers are in FIG. 1b shown to enclose an internal space inside the inner barrier layer 10 and an intermediate space between the inner 10 and outer 15 barrier layers. Such spaces may exist and are then preferably filled with an inert gas, such as nitrogen, or a substance that has a high diffusion rate for water as mentioned above, or they may be evacuated, such that both the inner 10 and outer 15 barrier layers closely follow the contours of the carrier and device (here OLED).

Figure 2A:
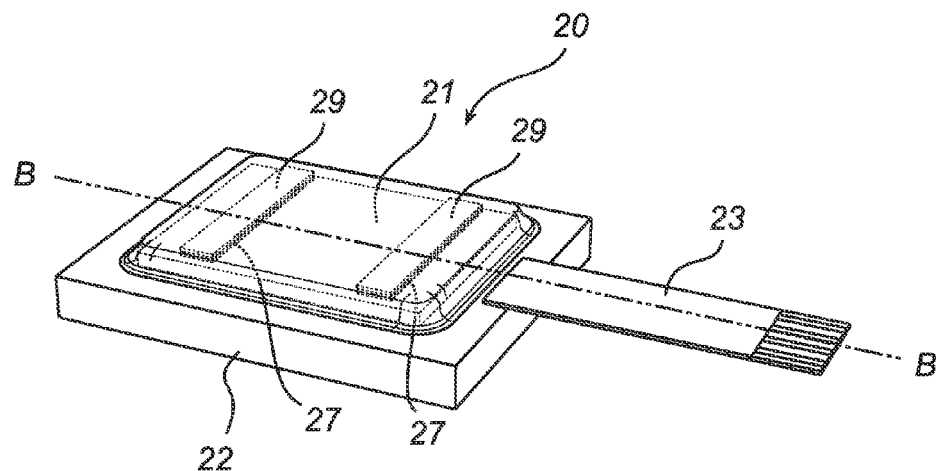
FIG. 2a is a schematic perspective view of a second embodiment of a package according to the present invention, protecting an OLED from the ambient.
Figure 2B:
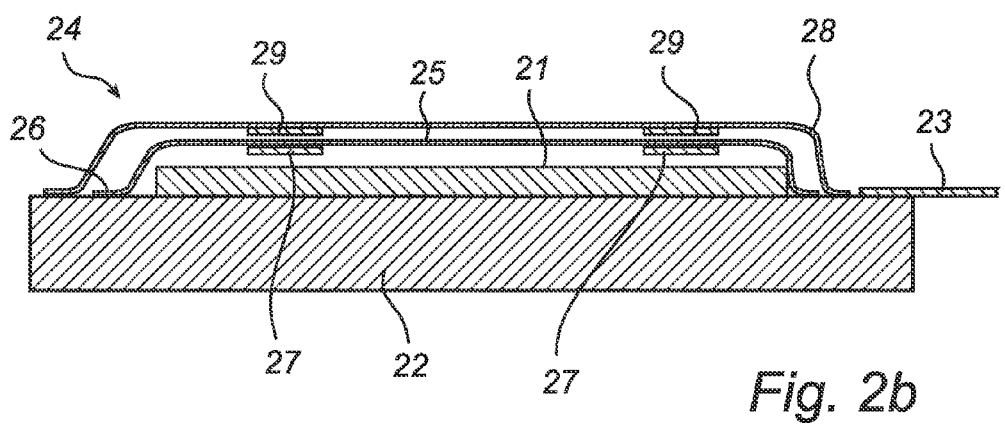
FIG. 2b is a schematic section view of a portion of the package in FIG. 2a along the line B-B.

With reference to FIGS. 2a-b, a second embodiment of the package according to the present invention will now be described.

In FIG. 2a, an OLED-package 20 is schematically shown, in which an OLED 21 is mounted on a rigid carrier 22 which is impermeable to the substance from which the OLED is to be protected by the package 20. In order to enable electrical connection of the OLED 21 to an external device, conductor patterns (not shown) on the rigid carrier 22 are connected to a flex lead-out 23 by means of, for example, ACF (Anisotropic Conductive Film) bonding.

The packaged OLED 21 is enclosed by the rigid carrier 22 and a multi-layer barrier 24 bonded thereon. The structure of this multi-layer barrier 24 will now be described in more detail with reference to FIG. 2b.

As illustrated in FIG. 2b, which is a schematic section view of the package 20 in FIG. 2a, the multi-layer barrier 24 is formed by an inner layer 25, which is here provided in the form of an inner film sheet which is heat-sealed to the carrier 22 along a perimeter 26 around the OLED 21. Inside the inner barrier layer 25, an internal substance binding member 27 is provided to bind molecules of a substance having penetrated the inner barrier layer 25.

The inner barrier layer 26 is enclosed by an outer barrier layer 28 which is also heat-sealed to the carrier 22. On the inside of the outer barrier layer 28, an intermediate substance binding member 29 is provided to bind molecules of a substance having penetrated the outer barrier layer 28, which effieciently reduces the number of molecules of the substance available for penetration through the inner barrier layer 25.

In both of the above-described embodiments of the present invention, each of the inner and outer barrier layers may preferably be formed by a transparent heat-sealable barrier foil which is formed by an organic base film having an inorganic barrier layer formed thereon. Furthermore, the internal and intermediate substance binding members have been positioned so as to interfere as little as possible with the light emitted by the packaged OLED. Alternatively, the substance binding members can be made transparent and may then be positioned without regard to the emission direction of the packaged OLED.

The person skilled in the art realizes that the present invention by no means is limited to the preferred embodiments. For example, the OLED used on the two exemplary embodiments described above may be replaced by any component needing to be protected from a substance in the ambient. Moreover, the separate seals for the inner and outer barrier foils in the embodiments described above may be replaced by a common seal for both the inner and outer barrier foils

The invention claimed is:
1. A package for protecting a device from at least one ambient substance, said package comprising:
 an enclosure surrounding said device, said enclosure including a multi-layer barrier and an internal substance binding member which is provided inside said enclosure to bind the at least one ambient substance that has penetrated said enclosure; and an intermediate substance binding member which is provided between an inner barrier layer of said multi-layer barrier and an outer barrier layer of said multi-layer barrier to bind at least a fraction of said at least one ambient substance that has penetrated said outer barrier layer, wherein a gap separates the multi-layer barrier from the device such that a diffusion rate of the at least one ambient substance is higher in the gap than in the intermediate substance, the inner barrier layer and the outer barrier layer.

2. A package according to claim 1, wherein said multi-layer barrier is transparent.

3. A package according to claim 1, wherein said multi-layer barrier is flexible.

4. A package according to claim 1, wherein:
said internal substance binding member is provided on said inner barrier layer; and
said intermediate substance binding member is provided on said outer barrier layer.

5. A package according to claim 1, wherein each of said internal and intermediate substance binding members is adapted to bind at least one of oxygen and moisture.

6. A package according to claim 1, wherein:
said device is mounted on a rigid carrier being impermeable to said at least one ambient substance; and
said multi-layer barrier is bonded to said rigid carrier to enclose said device.

7. A package according to claim 1, wherein:
said device is mounted on a flexible carrier,
the inner barrier layer is formed by an inner film enclosing said device,
the outer barrier layer is formed by an outer film enclosing said inner barrier layer, and
said multi-layer barrier is configured to enable an electrical coupling between the device and an external electrical connector.

8. A package according to claim 7, wherein:
said flexible carrier has a device-supporting portion and a lead-out portion; and
said inner film encloses said device and said device-supporting portion of the flexible carrier, and is bonded to upper and lower faces of said lead-out portion of the flexible carrier such that said lead-out portion penetrates said inner barrier layer; and
said outer film encloses said inner barrier layer, and is bonded to said upper and lower faces of said lead-out portion of the flexible carrier such that said lead-out portion penetrates said outer barrier layer.

9. A package according to claim 7, further comprising:
an electrically conductive lead-through for enabling electrical conduction from an internal conductor structure provided on an inside of said multi-layer barrier to an external conductor structure of the external electrical connector provided on an outside of said multi-layer barrier,
wherein said internal conductor structure is electrically connected to said device.

10. A light-emitting device comprising:
an organic light-emitting diode (OLED); and
a package for protecting said OLED from at least one ambient substance, said package comprising:
an enclosure surrounding said OLED, said enclosure including a multi-layer barrier and an internal substance binding member which is provided inside said enclosure to bind the at least one ambient substance that has penetrated said enclosure; and
an intermediate substance binding member which is provided between an inner barrier layer of said multi-layer barrier and an outer barrier layer of said multi-layer barrier to bind at least a fraction of said at least one ambient substance that has penetrated said outer barrier layer, wherein a gap separates the multi-layer barrier from the OLED such that a diffusion rate of the at least one ambient substance is higher in the gap than in the intermediate substance, the inner barrier layer and the outer barrier layer.

11. A sensing device comprising:
a sensor; and
a package for protecting said sensor from at least one ambient substance, said package comprising:
an enclosure surrounding said sensor, said enclosure including a multi-layer barrier and an internal substance binding member which is provided inside said enclosure to bind the at least one ambient substance having penetrated said enclosure; and
an intermediate substance binding member which is provided between an inner barrier layer of said multi-layer barrier and an outer barrier layer of said multi-layer barrier to bind at least a fraction of said at least one ambient barrier that has penetrated said outer barrier layer, wherein a gap separates the multi-layer barrier from the sensor such that a diffusion rate of the at least one ambient substance is higher in the gap than in the intermediate substance, the inner barrier layer and the outer barrier layer.

* * * * *